(12) United States Patent  
Suzumura et al.

(10) Patent No.: US 11,923,296 B2  
(45) Date of Patent: Mar. 5, 2024

(54) SEMICONDUCTOR DEVICE

(71) Applicant: RENESAS ELECTRONICS CORPORATION, Tokyo (JP)

(72) Inventors: Naohito Suzumura, Tokyo (JP); Kenichiro Sonoda, Tokyo (JP); Hideaki Tsuchiya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/841,203

(22) Filed: Jun. 15, 2022

(65) Prior Publication Data

US 2023/0061976 A1 Mar. 2, 2023

(30) Foreign Application Priority Data

Sep. 2, 2021 (JP) ................................. 2021-143196

(51) Int. Cl.  
*H01L 23/525* (2006.01)

(52) U.S. Cl.  
CPC .............................. *H01L 23/5256* (2013.01)

(58) Field of Classification Search  
CPC ........................... H01L 23/5256; H01L 23/62  
See application file for complete search history.

(56) References Cited

U.S. PATENT DOCUMENTS

| 5,285,099 A | * | 2/1994 | Carruthers | ............ | H01L 27/118 |
| | | | | | 257/E27.105 |
| 8,564,090 B2 | | 10/2013 | Oda | | |
| 2005/0012587 A1 | * | 1/2005 | Leigh | ..................... | G11C 17/16 |
| | | | | | 257/E23.149 |
| 2008/0068047 A1 | * | 3/2008 | Hashimoto | ......... | H01L 23/5258 |
| | | | | | 257/E21.616 |
| 2014/0252538 A1 | * | 9/2014 | Bao | ..................... | H01L 23/5256 |
| | | | | | 257/529 |

FOREIGN PATENT DOCUMENTS

JP 2011-124370 A 6/2011

* cited by examiner

*Primary Examiner* — Laura M Menz  
*Assistant Examiner* — Candice Chan  
(74) *Attorney, Agent, or Firm* — Rimon P.C.

(57) ABSTRACT

An interlayer dielectric layer covers an electric fuse element. A resistance layer made of silicon metal is arranged on the interlayer dielectric layer and directly above the electric fuse element.

17 Claims, 20 Drawing Sheets

SEMICONDUCTOR DEVICE

CROSS-REFERENCE TO RELATED APPLICATIONS

The disclosure of Japanese Patent Application No. 2021-143196 filed on Sep. 2, 2021, including the specification, drawings and abstract is incorporated herein by reference in its entirety.

BACKGROUND

The present invention relates to semiconductor device, for example, it can be suitably utilized for semiconductor device having an electric fuse.

There are disclosed techniques listed below.
[Patent Document 1] Japanese Unexamined Patent Application Publication No. 2011-124370

Electric fuses that are fused by an electric current are known. Patent Document 1 discloses, for example, a technique for making this electric fuse easier to cut.

In Patent Document 1, the electric fuse is configured by a first wiring. A second wiring and a third wiring are arranged on both sides of the cut portion of the electric fuse. An air gap is provided between the cut portion and the second wiring and between the cut portion and the third wiring, respectively.

The air gap provided on the side of the cut portion functions as a heat shield region during cutting of the electric fuse. This reduces the heat radiation from the cut portion, the cut portion is effectively heated, and the electric fuse is easily cut.

SUMMARY

However, in Patent Document 1, the second wiring and the third wiring need to be arranged on both sides of the electric fuse with air gap therebetween. Therefore, the plane occupied area of the configuration to facilitate fusing the electric fuse is increased. Therefore, the plane occupied area of the circuit including the electric fuse and the cutting transistor for cutting the electric fuse is increased.

Other objects and novel features will become apparent from the description of this specification and the accompanying drawings.

According to a semiconductor device according to one embodiment, a resistance layer made of silicon metal is arranged directly above the electric fuse.

According to one embodiment, it is possible to realize a semiconductor device that can be easily miniaturized in a configuration having an electric fuse element.

DETAILED DESCRIPTION

Figure 1:
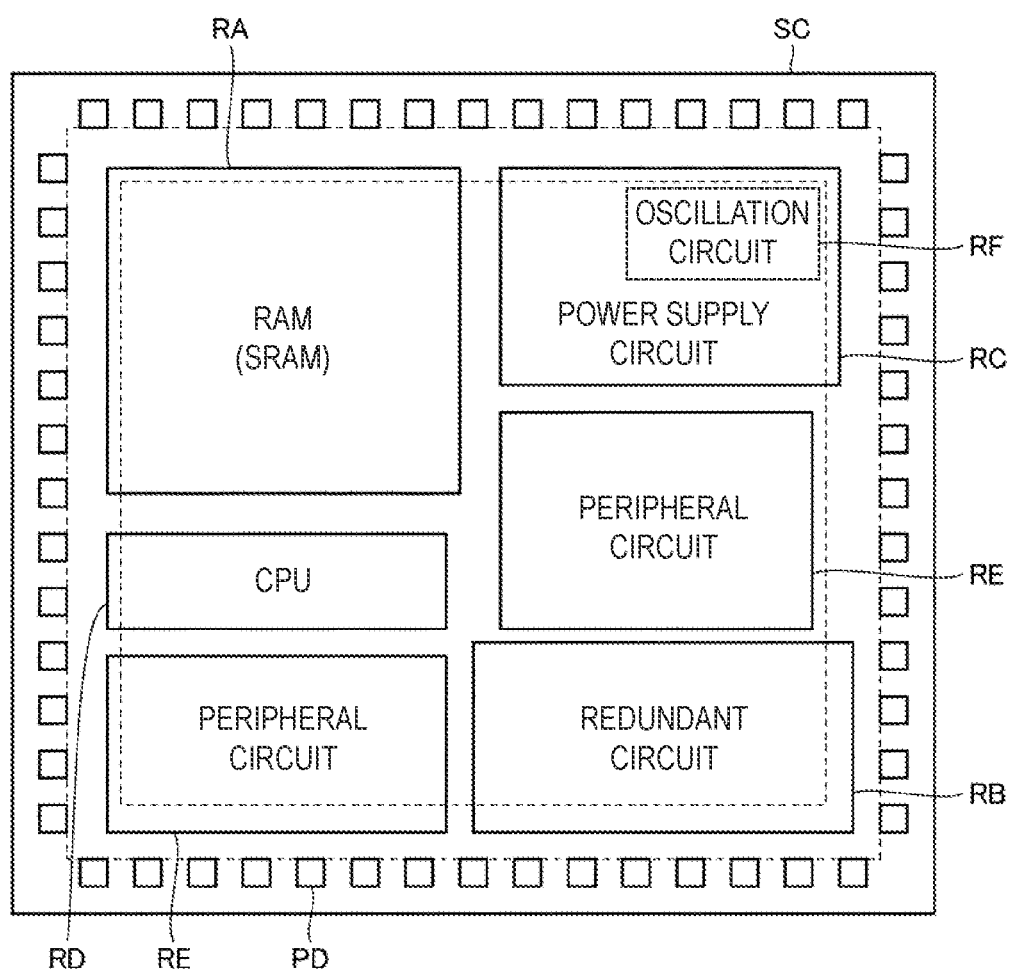
FIG. 1 is a plan view showing a configuration of a semiconductor device according to first embodiment in a chip state.

Hereinafter, embodiments of the present disclosure will be described in detail with reference to the drawings. In the specification and drawings, the same or corresponding components are denoted by the same reference numerals, and a repetitive description thereof is not repeated. In the drawings, for convenience of description, the configuration may be omitted or simplified. Further, at least a part of each embodiment and each modified example may be arbitrarily combined with each other.

Semiconductor devices of the embodiments described below are not limited to semiconductor chips, may be semiconductor wafers prior to being divided into semiconductor chips, also may be semiconductor packages in which the semiconductor chips are sealed with a resin. Also, a plan view in this specification means a viewpoint viewed from a direction perpendicular to the surface of the semiconductor substrate.

First Embodiment

Configuration of Semiconductor Device in the Chip State

First, a configuration of the chip state as a configuration of the semiconductor device according to the first embodiment will be described with reference to FIG. 1.

As shown in FIG. 1, the semiconductor device SC in the present embodiment is, for example, a microcomputer. The semiconductor device SC is, for example, in a chip state and has a semiconductor substrate. Electric elements are arranged on and above the semiconductor substrate. The semiconductor device SC includes, for example, a RAM (Random Access Memory) region RA, a redundant circuit region RB, a power supply circuit region RC, a CPU (Central Processing Unit) region RD, and a peripheral circuit region RE. The power supply circuit region RC has, for example, an oscillation circuit region RF. The semiconductor device SC has a plurality of pad electrode PD. Each of the plurality of pad electrodes PD is electrically connected to an electric element arranged in the semiconductor device SC.

Oscillation circuit is arranged in the oscillation circuit region RF. The oscillation circuit, for example, generates an output signal of a predetermined oscillation period by oscillation operation by repetition of charging and discharging of the capacitive element. The oscillation circuit is, for example, a HOCO (High-speed On-Chip Oscillator) circuit, but may be a LOCO (Low-speed On-Chip Oscillator) circuit and may include both a HOCO circuit and a LOCO circuit.

Spare redundant circuit portion is arranged in the redundant circuit region RB. Spare redundant circuit portion has the same function as the specific circuit portion having a predetermined function. In the redundant circuit region RB, in order to replace the specific circuit portion in the redundant circuit portion, an electric fuse which is to be fused and removed is provided.

Configuration and Function of the Redundant Circuit Portion and the Electric Fuse Next, the configuration and function of the redundant circuit portion and the electric fuse will be described with reference to FIGS. 2 and 3.

Figure 2:
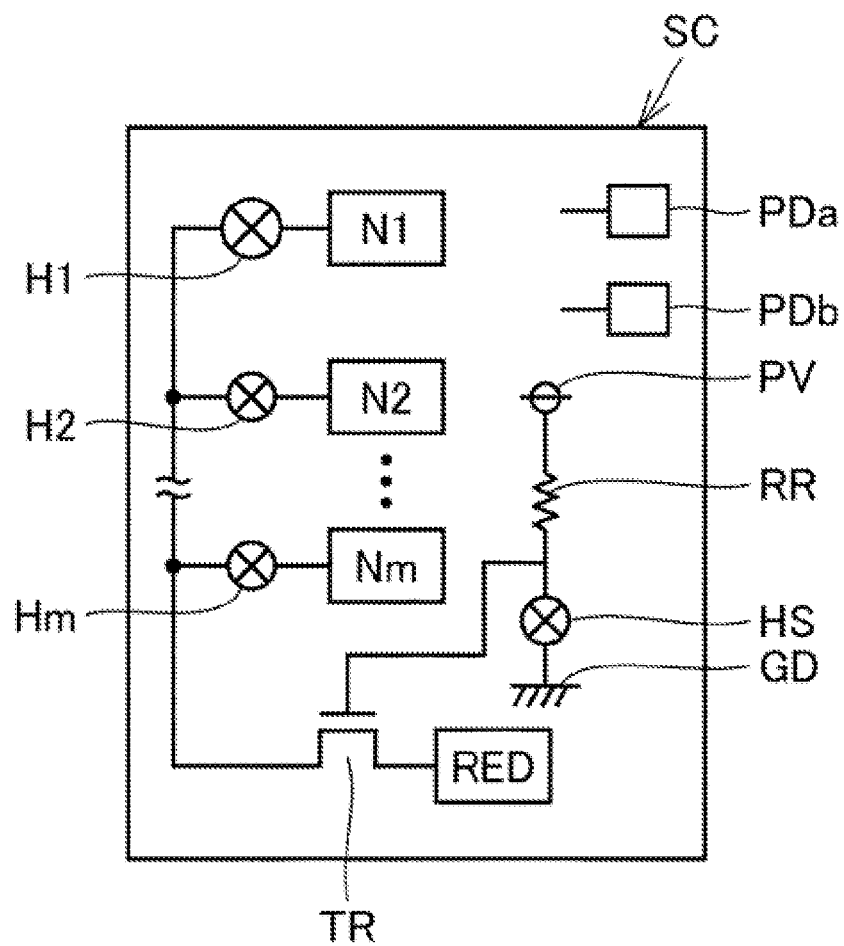
FIG. 2 is a plan view schematically showing a configuration of a semiconductor chip in which a redundant circuit is formed.

As shown in FIG. 2, in the semiconductor device SC, a plurality of blocks (specific circuit portion) N1, N2, ..., Nm are arranged. Each of the plurality of blocks N1, N2, ..., Nm has the same function. Each of the plurality of blocks N1, N2, ..., Nm is configured by a plurality of memory cells in the RAM region RA (FIG. 1), for example.

Cuttable fuses H1, H2, ..., Hm are formed to deactivate each of the plurality of blocks N1, N2, ..., Nm. A spare redundant block RED having the same function is arranged so as to be able to replace any one of the inactivated blocks N1, N2, ..., Nm. The redundant block RED is arranged in the redundant circuit region RB shown in FIG. 1.

A potential of the ground power supply GD is applied to the gate electrode of the MOS (Metal Oxide Semiconductor) transistor TR via a fuse HS. Thus, the MOS transistor TR is held in a non-conducting state. Thus, the redundant block RED is electrically separated in the semiconductor device SC.

In addition, test pad electrodes PDa, PDb are arranged to detect defects in each of the plurality of blocks N1, N2, ..., and Nm.

Next, a functional test of the semiconductor device configured as described above will be described. Here, a case where the fuse is fused and removed by energization will be described.

First, an electric signal from a functional test apparatus (hereinafter also referred to as a tester) not shown is applied via the test pad electrodes PDa, PDb. If the semiconductor device SC is normal, the expected signal for the applied electric signal is output from the test pad electrodes PDa, PDb. At this time, the tester determines whether the semiconductor device SC is good or defective based on the relationship between the electric signal applied to the semiconductor device SC and the electric signal output. If any of the blocks N1, N2, ..., Nm is determined to be defective, the defective block and the redundant block RED are replaced. This ensures that the semiconductor device SC satisfies the functions that it should achieve, thereby creating a possibility that the semiconductor device SC will be a good product.

The replacement of the defective block and the redundant block RED is performed as follows. When a defect of the block N1 is detected by the above-described functional test, for example, the fuses H1 and HS are fused and removed by energization. The defective block N1 is electrically separated in the semiconductor device SC due to the fused fuse H1.

On the other hand, by the fused fuse HS, the voltage of the power supply PV is applied to the gate electrode of the MOS transistor TR via the resistor RR. This causes the MOS transistor TR to become conduction state and the defective block N1 is replaced by the redundant block RED.

Next, the fusing removal of the electric fuse element which is fused and removed by energization will be described with reference to FIG. 3.

Figure 3:
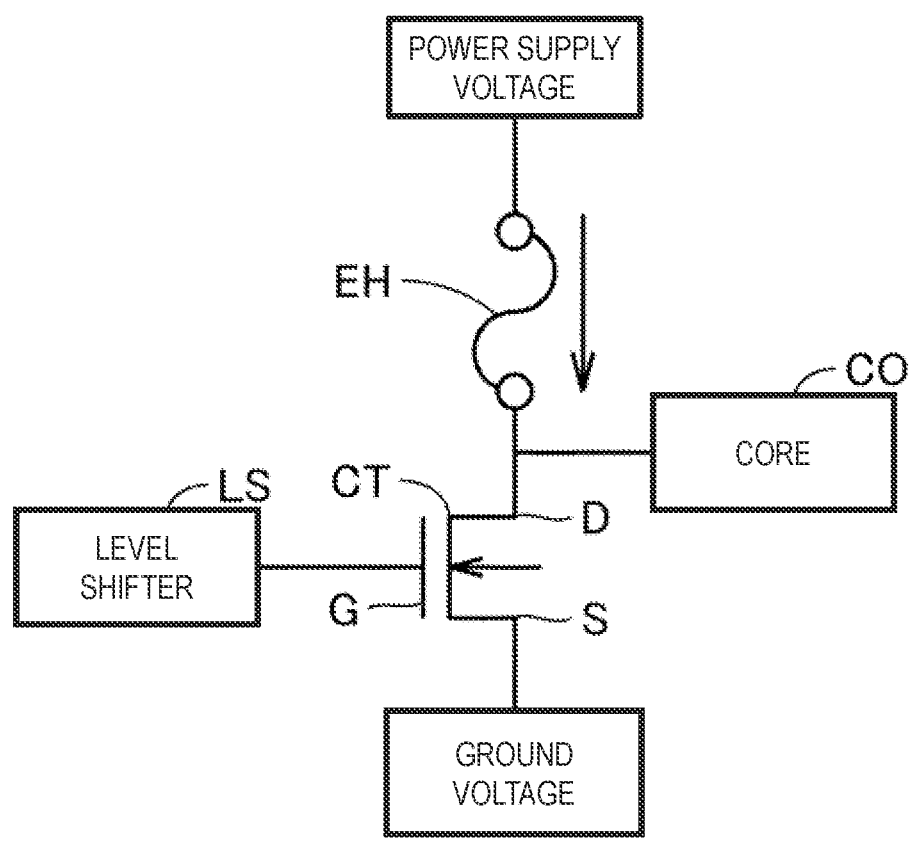
FIG. 3 is a diagram showing a circuit configuration having an electric fuse.

As shown in FIG. 3, the electric fuse element EH is a fuse that cut by flowing a current rather than cutting by irradiating a laser beam. As a switching element for flowing a current to the electric fuse element EH, the cutting transistor CT is provided.

One end of the electric fuse element EH is electrically connected to the power supply voltage (Vdd). The other end of the electric fuse element EH is electrically connected to the drain D of the cutting transistor CT. The source S of the cutting transistor CT is connected to the ground voltage (GND).

Level shifter LS is electrically connected to the gate G of the cutting transistor CT. Level shifter LS inputs a signal for turning on and off the cutting transistor CT to the gate G of the cutting transistor CT. To each of the other end of the electric fuse element EH and the drain of the cutting transistor CT, the core portion CO is electrically connected.

If any one of the blocks N1, N2, ..., Nm (FIG. 2) is determined to be defective, the cutting transistor CT is turned on by the level shifter LS. Thus a current flows through the electric fuse element EH, the electric fuse element EH is fused and removed. The core portion CO is a determination circuit for determining the state of the electric fuse element EH, and if it is determined that the electric fuse element EH has been fused and removed, replacement is performed based on the determination result.

Configuration of Electric Fuse Element

Next, the configuration of the electric fuse element included in the semiconductor device according to the present embodiment will be described with reference to FIGS. 4 and 5.

Figure 5:
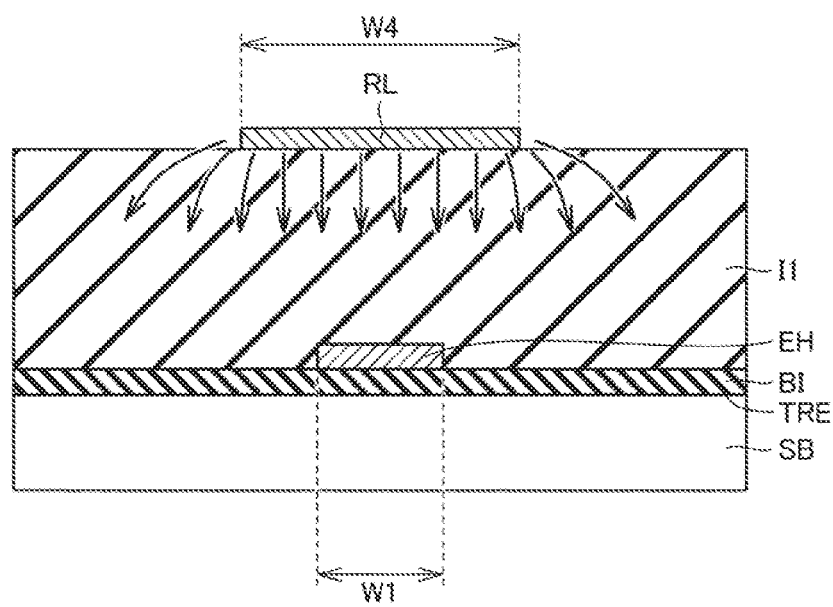
FIG. 5 is a cross-sectional view along the V-V line in FIG. 4.

As shown in FIG. 5, a trench TRE is formed on the surface of the semiconductor substrate SB. A dielectric layer BI is embedded in the trench TRE. An STI (Shallow Trench Isolation) structure is configured by the trench TRE and the dielectric layer BI.

An electric fuse element EH is arranged on the STI structure. The electric fuse element EH is made of, for example, polycrystalline silicon which impurities are introduced (hereinafter, referred to as doped polysilicon).

An interlayer dielectric layer I1 is arranged on the surface of the semiconductor substrate SB so as to cover the electric fuse element EH. The interlayer dielectric layer I1 is made of, for example, a silicon oxide film. An upper surface of the interlayer dielectric layer I1 is planarized.

A resistance layer RL is arranged directly above the electric fuse element EH and on an upper surface of the interlayer dielectric layer I1. The resistance layer RL is made of silicon metal. The silicon metal is, for example, silicon chromium (SiCr) or carbon-doped silicon chromium (SiCrC).

Figure 4:
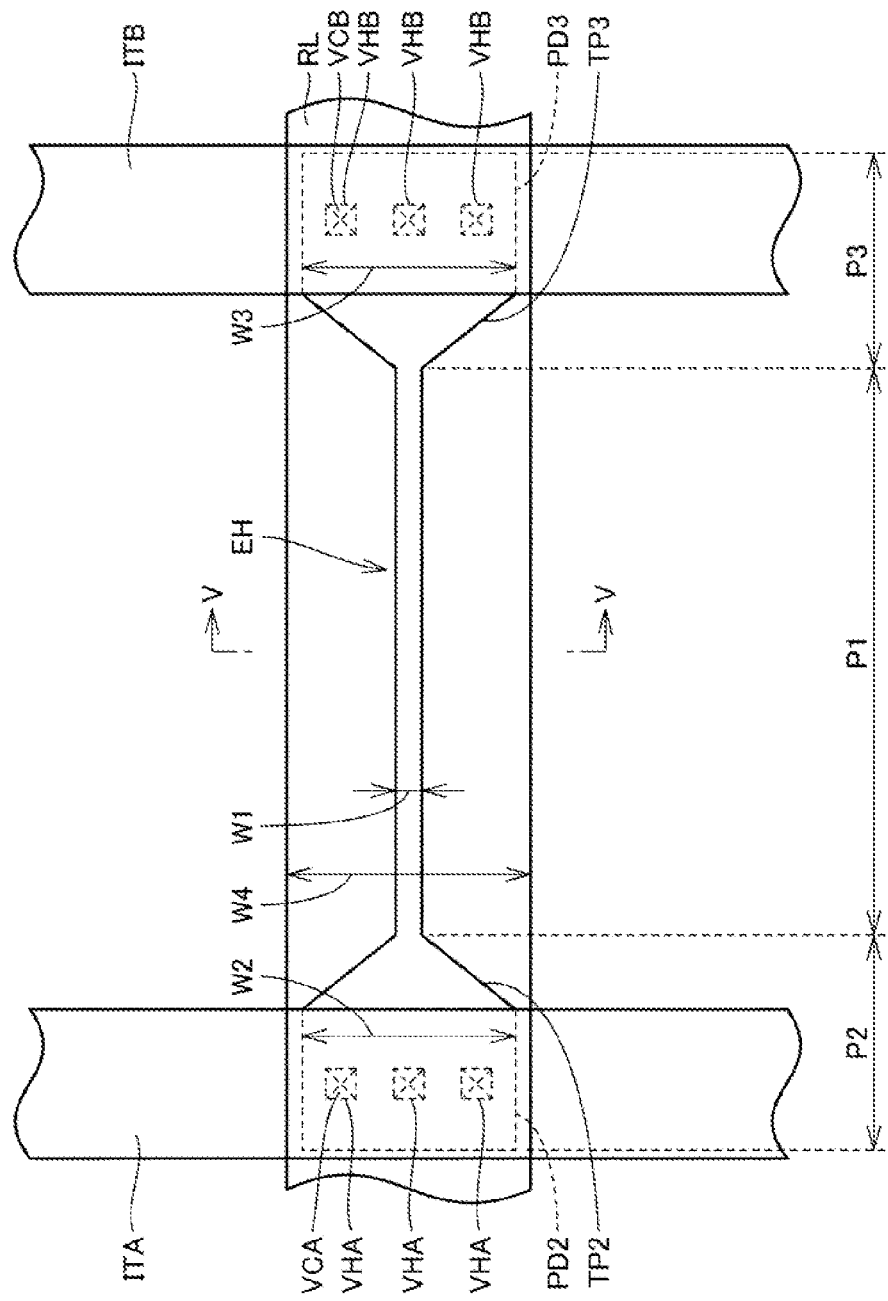
FIG. 4 is a plan view showing the configuration of the semiconductor device according to the first embodiment.

As shown in FIG. 4, the electric fuse element EH has a first portion P1, a second portion P2, and a third portion P3. The second portion P2 is arranged at one end of the first portion P1. The third portion P3 is arranged at the other end of the first portion P1. The first portion P1 is sandwiched between the second portion P2 and the third portion P3.

At least one portion of each of the second portion P2 and the third portion P3 has a wiring width W2, W3 greater than the wiring width W1 of the first portion P1. In the present embodiment, each of the maximum wiring width W2 of the second portion P2 and the maximum wiring width W3 of the third portion P3 is larger than the wiring width W1 of the first portion P1.

The second portion P2 has a tapered portion TP2 and a pad portion PD2 in plan view. The tapered portion TP2 is connected to the first portion P1. The pad portion PD2 is connected to the tapered portion TP2. The tapered portion TP2 is arranged between the first portion P1 and the pad portion PD2. The tapered portion TP2 is configured such that the wiring width gradually increases from the first portion P1 toward the pad portion PD2 in plan view. The pad portion PD2 has, for example, a rectangular shape in plan view.

Third portion P3 has a tapered portion TP3 and a pad portion PD3 in plan view. The tapered portion TP3 is connected to the first portion P1. The pad portion PD3 is connected to the tapered portion TP3. The tapered portion TP3 is arranged between the first portion P1 and the pad portion PD3. Tapered portion TP3 is configured such that the wiring width gradually increases from the first portion P1 toward the pad portion PD3 in plan view. The pad portion PD3 has, for example, a rectangular shape in plan view. The pad portions PD2, PD3 may be directly connected to the first portion P1 without the tapered portions TP2, TP3.

The pad portion PD2 is electrically connected to wiring layer ITA via the via hole VHA and the via conductive layer VCA embedded in the via hole VHA. The pad portion PD3 is electrically connected to wiring layer ITB via the via hole VHB and the via conductive layer VCB embedded in the via hole VHB. Each of the wiring layers ITA, ITB is arranged above the electric fuse element EH. The wiring layers ITA, ITB are layers formed separately from each other from the same layer. Each of the wiring layers ITA, ITB is made of metal, for example, aluminum (Al), copper (Cu), aluminum-copper (AlCu), etc.

The resistance layer RL is arranged above the wiring layers ITA, ITB. The resistance layer RL is arranged so as to overlap the electric fuse element EH in plan view. The resistance layer RL overlaps the entire electric fuse element EH in plan view. The resistance layer RL may not overlap the second portion P2 and the third portion P3 in plan view, but may overlap only the first portion P1.

A wiring width W4 of the resistance layer RL is preferably larger than the wiring width W1 of the first portion P1 of the electric fuse element EH. The wiring width W4 of the resistance layer RL is preferably larger than the wiring width W2 of the second portion P2 and the wiring width W3 of the third portion P3 of the electric fuse element EH.

Effect

Next, effects of the semiconductor device according to the present embodiment will be described.

In the configuration shown in FIG. 5, the present inventors have investigated how the temperature of the electric fuse element EH is changed when the resistance layer RL made of silicon metal generates heat by flowing a current. In the simulation, the wiring width W4 of the resistance layer RL was set to 9.5 μm, and the wiring width W1 of the first portion P1 of the electric fuse element EH was set to 0.18 μm. The result is shown in FIG. 6.

Figure 6:
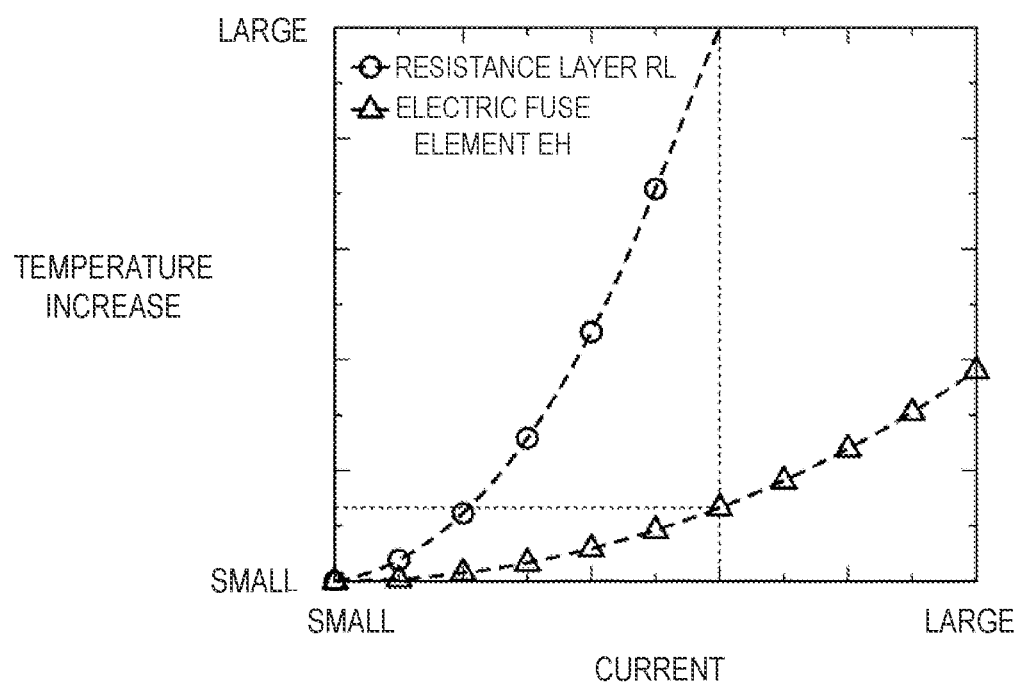
FIG. 6 is a diagram showing a temperature change of the electric fuse element when heating the resistor.

The horizontal axis in the graph of FIG. 6 is the amount of current flowing through the resistance layer RL, the vertical axis is the temperature increase of each of the resistance layer RL and the electric fuse element EH. From the result of FIG. 6, it was found that the larger the amount of current flowing through the resistance layer RL, the higher the temperature of the resistance layer RL. And with the temperature increase of the resistance layer RL, it was found that the temperature of the electric fuse element EH also increases.

In the present embodiment, as shown in FIG. 5, the resistance layer RL is made of silicon metal. The silicon metal is a material that is easier to generate heat than polycrystalline silicon. Therefore, the resistance layer RL easily generates heat by energizing the resistance layer RL. By the heat generated by the resistance layer RL, the electric fuse element EH located directly under the resistance layer RL is heated. The heated electric fuse element EH is easily fused by energization.

When the electric fuse element EH is made of, for example, doped polysilicon, the electric fuse element EH is fused by utilizing electromigration due to energization. By the electric fuse element EH is heated by heat generation of the resistance layer RL, electromigration in the electric fuse element EH is promoted, the electric fuse element EH is easily fused.

Since it is possible to reduce the current flowing through the electric fuse element EH when fusing the electric fuse element EH as described above, it is possible to reduce the size of the cutting transistor CT (FIG. 3). Therefore, it is possible to realize a configuration for fusing the electric fuse element EH in a small plane occupied area.

Generally, wiring or the like is not arranged directly above the electric fuse element EH. If the electric fuse element EH is fused, because such as wiring arranged directly above the electric fuse element EH is damaged. However, the resistance layer RL in the present embodiment is used only for heating the electric fuse element EH. Therefore, it is sufficient to heat the electric fuse element EH when fusing the electric fuse element EH, the resistance layer RL is a layer that may be damaged at the time of fusing the electric fuse element EH.

Modified Example of First Embodiment

Next, a modified example of the semiconductor device according to the first embodiment will be described with reference to FIG. 7.

Figure 7:
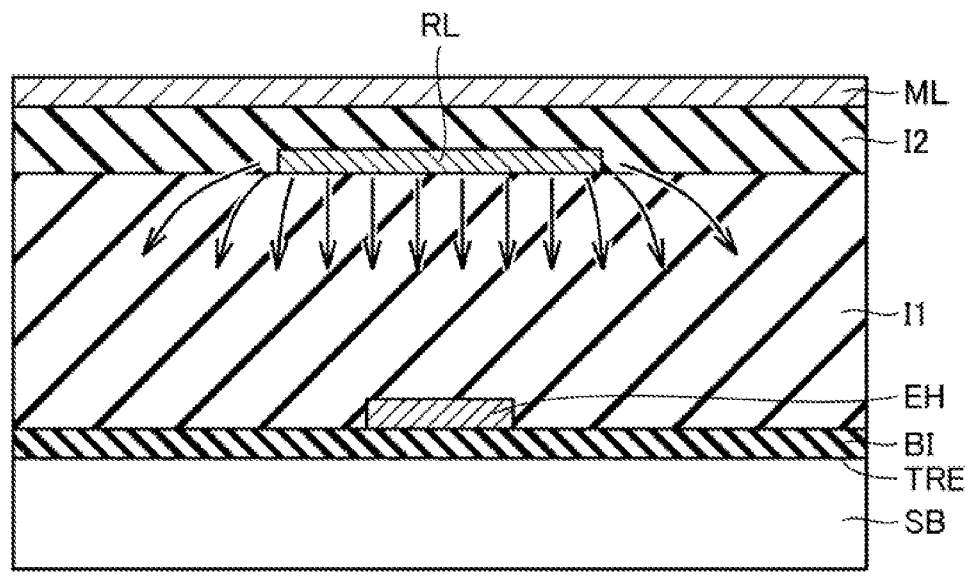
FIG. 7 is a cross-sectional view showing the configuration of a modified example of the semiconductor device according to the first embodiment.

As shown in FIG. 7, in the present modified example, the interlayer dielectric layer I2 is formed on the interlayer dielectric layer I1 so as to cover the resistance layer RL. The interlayer dielectric layer I2 is made of, for example, a silicon oxide film. A metal layer ML is arranged directly above the resistance layer RL and on the interlayer dielectric layer I2, for example. The metal layer ML is made of metal, for example, aluminum, copper, or aluminum-copper, etc. The metal layer ML is made of a material having a higher thermal conductivity than the interlayer dielectric layer I2.

Since the configuration of the present modified example other than the above is substantially the same as the configuration of the first embodiment, the same elements are denoted by the same reference numerals, and descriptions thereof will not be repeated.

In the present modified example, the metal layer ML is arranged directly above the resistance layer RL. The metal layer ML is made of a material having a higher thermal conductivity than the interlayer dielectric layer I2. Therefore, a portion of the heat generated in the resistance layer RL can be escaped upward through the metal layer ML. Thus the temperature of the resistance layer RL is suppressed to be higher than necessary, the resistance layer RL is suppressed from being fused.

Second Embodiment

Next, the configuration of the semiconductor device according to the second embodiment will be described with reference to FIGS. 8 and 9.

Figure 8:
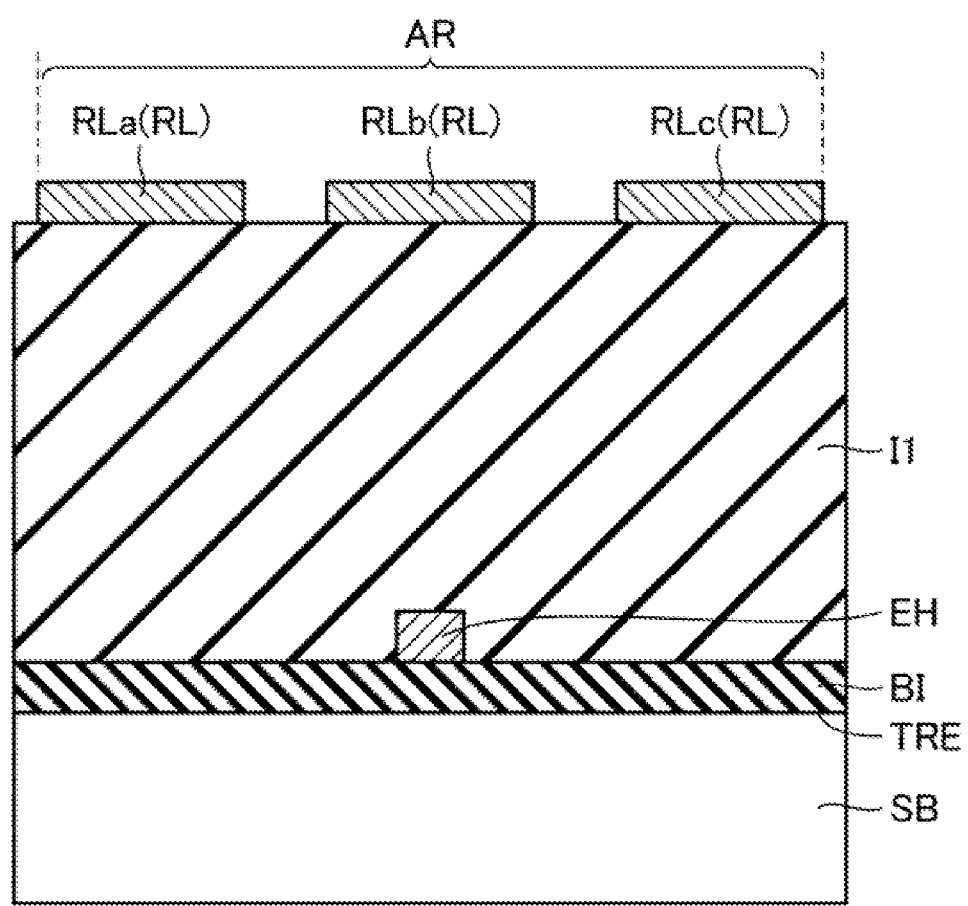
FIG. 8 is a cross-sectional view showing a configuration of a semiconductor device according to second embodiment.

As shown in FIG. 8, in the present embodiment, the resistance layer RL includes a plurality of resistance portions RLa, RLb, and RLc. Each of the plurality of resistance portions RLa, RLb, and RLc is made of silicon metal, for example, silicon chromium or silicon chromium into which carbon is introduced. The resistance layer RL is not limited to the three resistance portions RLa to RLc, may have two or four or more resistance portions.

Each of the plurality of resistance portions RLa to RLc is formed in contact with the upper surface of the interlayer dielectric layer I1. An arrangement region AR of the plurality of resistance portions RLa to RLc is located directly above the electric fuse element EH. At least one resistance portion of the plurality of resistance portions RLa to RLc (e.g., resistance portion RLb) is preferably located directly above the electric fuse element EH.

Figure 9:
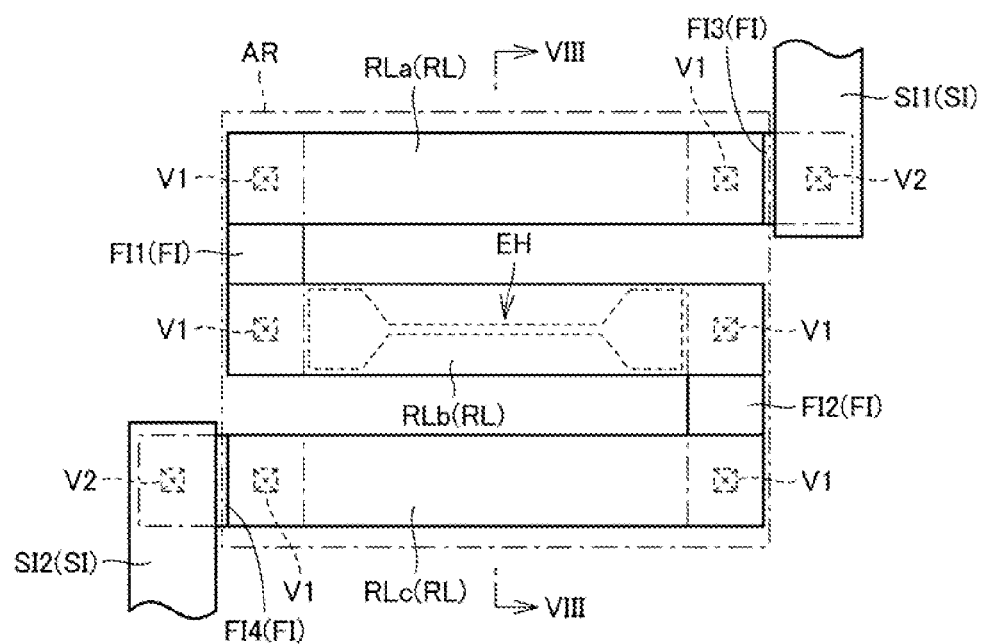
FIG. 9 is a plan view showing a configuration in which a plurality of resistance portions is connected in series as the semiconductor device according to the second embodiment.

As shown in FIG. 9, the arrangement region AR of the plurality of resistance portions RLa to RLc in plan view overlaps the electric fuse element EH. Further, in plan view, it is preferable that at least one resistance portion of the plurality of resistance portions RLa to RLc (e.g., resistance portion RLb) overlaps the electric fuse element EH.

The arrangement region AR of the plurality of resistance portions RLa to RLc is a region including a plurality of resistance portions RLa to RLc and a space between each other in the plurality of resistance portions RLa to RLc in plan view.

When the resistance layer RL is configured by a plurality of resistance portions RLa to RLc, that the resistance layer RL is arranged directly above the electric fuse element EH means that the arrangement region AR of the plurality of resistance portions RLa to RLc is arranged directly above the electric fuse element EH.

The plurality of resistance portions RLa to RLc may be electrically connected in series. In this case, the plurality of resistance portions RLa to RLc is connected in the order of, for example, the resistance portion RLa, the resistance portion RLb, and the resistance portion RLc.

Specifically, one end portion of the resistance portion RLa in the longitudinal direction is electrically connected to one end portion of the resistance portion RLb in the longitudinal direction via the wiring layer FI1. The other end portion of the resistance portion RLb in the longitudinal direction is electrically connected to one end portion of the resistance portion RLc in the longitudinal direction via the wiring layer FI2.

It is preferable that each of the plurality of resistance portions RLa to RLc is arranged such that the current path in the resistance layer RL meanders in plan view. Specifically, the longitudinal direction of each of the plurality of resistance portions RLa to RLc is, for example, along the same direction, and is parallel to each other. In such an arrangement, the end portions of the resistance portions RLa to RLc adjacent to each other in the longitudinal direction are electrically connected to each other via wiring layers FI1, FI2 as described above.

If the current path of the resistance layer RL meanders in plan view, the longitudinal direction of each of the plurality of resistance portions RLa to RLc may not be along the same direction to each other.

In plan view, the other end portion of the resistance portion RLa in the longitudinal direction is electrically connected to the wiring layer SI1 via the wiring layer FI3. Further, in plan view, the other end portion of the resistance portion RLc in the longitudinal direction is electrically connected to the wiring layer SI2 via the wiring layer FI4.

Note that each of the wiring layers FI1 to FI4 is a layer formed separately from each other from the same conductive layer FI, and is arranged, for example, in the lower layer of the resistance portions RLa to RLc. Each of the wiring layers SI1, SI2 is a layer formed separately from the same conductive layer SI, for example, and is arranged on the upper layer of the resistance portions RLa to RLc. Each of the wiring layers FI1 to FI4 and the wiring layers SI1, SI2 is made of, for example, aluminum, copper, aluminum-copper, and the like.

Each of the resistance portions RLa, RLb is electrically connected to the wiring layer FI1 via the via hole V1. Each of the resistance portions RLb, RLc is electrically connected to the wiring layer FI2 via the via hole V1.

The resistance portion RLa is electrically connected to the wiring layer FI3 via the via hole V1. The resistance portion RLc is electrically connected to the wiring layer FI4 via the via hole V1. The wiring layer FI3 is electrically connected to the wiring layer SI1 via the via hole V2. The wiring layer FI4 is electrically connected to the wiring layer SI2 via the via hole V2.

Since the configuration of the present embodiment other than the above is substantially the same as the configuration of the first embodiment, the same elements are denoted by the same reference numerals, and descriptions thereof will not be repeated.

According to the present embodiment, as shown in FIG. 9, the resistance layer RL is divided into a plurality of resistance portions RLa to RLc. Thus, each of the wiring widths of the resistance portions RLa to RLc can be reduced, and the fusing resistance of the resistance layer RL can be improved.

However, each of the wiring widths of the resistance portions RLa to RLc is reduced, and the heat generation efficiency is reduced. Therefore, a plurality of resistance portions RLa to RLc is arranged so as to extend parallel to each other in the longitudinal direction in plan view. In particular, in the present embodiment, a plurality of resistance portions RLa to RLc are arranged so that the current path of the resistance layer RL meanders in plan view. Thus the arrangement density of the resistance portions RLa to RLc in the arrangement region AR in plan view is improved, it is possible to increase the heat generation efficiency.

Further, a plurality of resistance portions RLa to RLc is electrically connected in series. This makes it possible to reduce the current required for heat generation.

Modified Example of Second Embodiment

Next, a modified example of the semiconductor device according to the second embodiment will be described with reference to FIG. 10.

Figure 10:
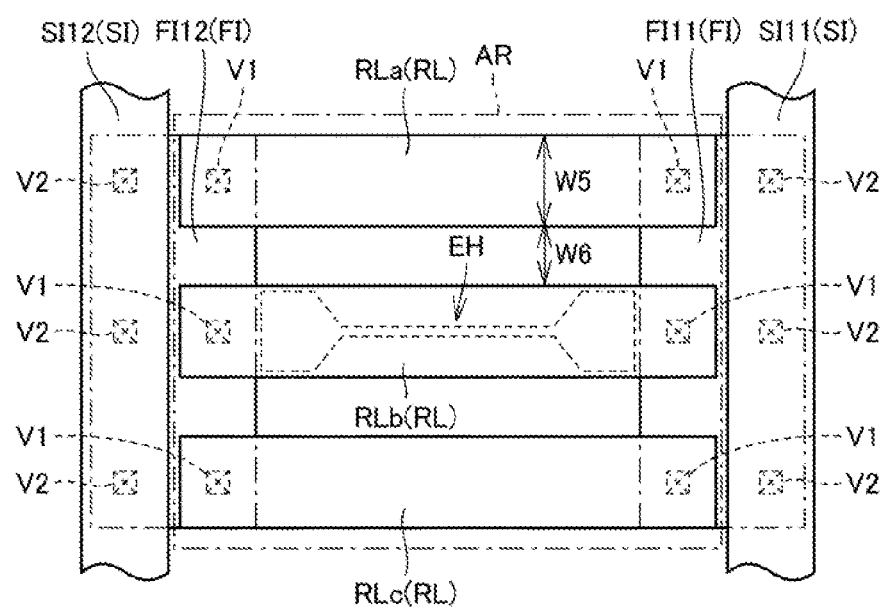
FIG. 10 is a plan view showing a configuration in which a plurality of resistance portions is connected in parallel as a modified example of the semiconductor device according to the second embodiment.

As shown in FIG. 10, a plurality of resistance portions RLa to RLc may be electrically connected in parallel. In this case, the longitudinal direction of each of the plurality of resistance portions RLa to RLc is, for example, along the same direction, and is parallel to each other. In such an arrangement, one end portions of the plurality of resistance portions RLa to RLc are electrically connected to each other by a wiring layer FI11 via the via hole V1. The other end portions of the plurality of resistance portions RLa to RLc are electrically connected to each other by another wiring layer FI12 via the via hole V1. The wiring layer SI11 is electrically connected to the wiring layer FI11 via the via hole V2. The wiring layer SI12 is electrically connected to the wiring layer FI12 via the via hole V2.

If the plurality of resistance portions RLa to RLc is connected in parallel to each other, the longitudinal direction of each of the plurality of resistance portions RLa to RLc may not be along the same direction to each other.

Note that each of the wiring layers FI11, FI12 is a layer formed separately from each other from the same conductive layer FI, and is arranged, for example, in the lower layer of the resistance portions RLa to RLc. Each of the wiring layers SI11, SI12 is a layer formed separately from each other from the same conductive layer SI, for example, and is arranged on the upper layer of the resistance portions RLa to RLc. Each of the wiring layers FI11, FI12 and the wiring layers SI11, SI12 is made of, for example, aluminum, copper, aluminum-copper, and the like.

Since the configuration of the present modified example other than the above is substantially the same as the configuration of the second embodiment, the same elements are denoted by the same reference numerals, and descriptions thereof will not be repeated.

The present inventors have investigated the temperature change $\Delta T_{EH}$ of the electric fuse element EH with respect to the temperature change $\Delta T_{RL}$ of the resistance layer RL when a current flows through the resistance layer RL to generate heat in each of the samples A to C. Each of the resistance layers RL in the samples A, C has a configuration formed only of a single resistance portion as shown in FIG. 5. The resistance layer RL in the sample B has a configuration in which a plurality of resistance portions RLa to RLc is connected in parallel as shown in FIG. 10.

In the sample A, the wiring width W4 of the resistance layer RL shown in FIG. 5 was set to 1.9 μm. In the sample C, the wiring width W4 of the resistance layer RL shown in FIG. 5 was set to 9.5 μm. In the sample B, the wiring width W5 of each of the resistance portions RLa to RLc shown in FIG. 9 was set to 1.9 μm, and the distance W6 of each of the resistance portions RLa to RLc was set to 1.9 μm. The result of the above simulation are shown in FIG. 11.

Figure 11:
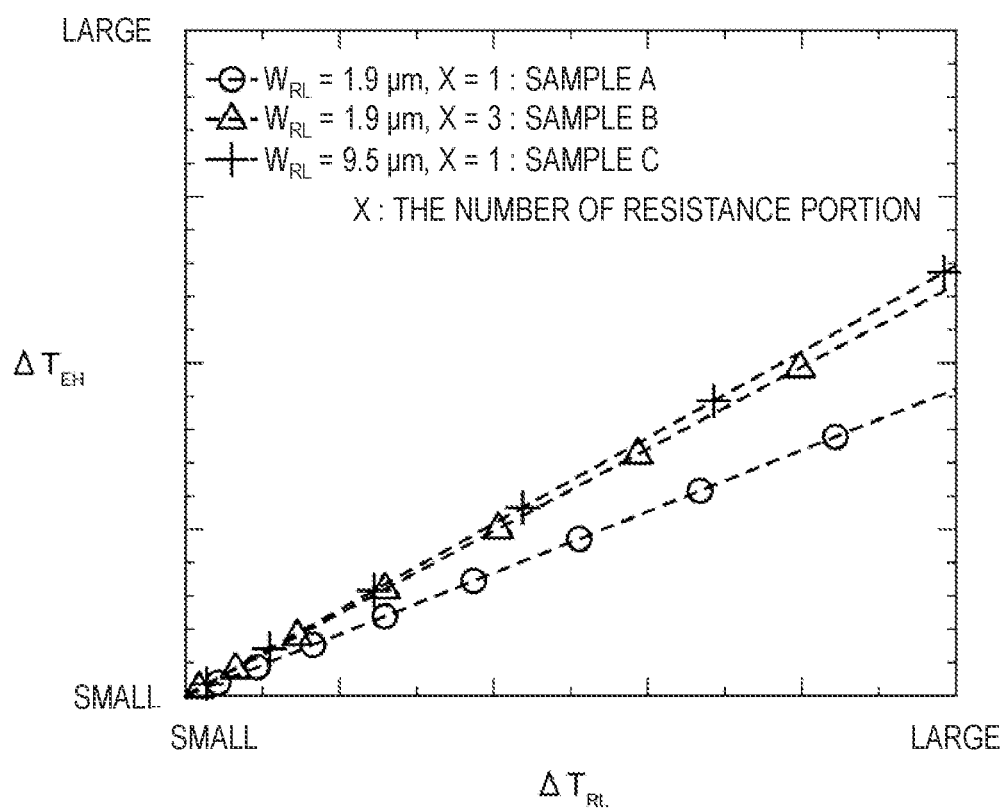
FIG. 11 is a diagram showing the relationship between the temperature change of the electric fuse element and the temperature change in each of the single resistance portion with narrow width, the single resistance portion with thick width, and the configuration in which each of the plurality of resistance portions with thin width is connected in parallel.

In the graph of FIG. 11, the horizontal axis represents the temperature change $\Delta T_{RL}$ of the resistance layer RL, and the vertical axis represents the temperature change $\Delta T_{EH}$ of the electric fuse element EH. From the result of FIG. 11, in sample A, it was found that the temperature increase of the electric fuse element EH with respect to the temperature increase of the resistance layer RL is smaller than the sample C. From this, in the sample A having a single resistance portion with narrow width, it was found that the efficiency of heating the electric fuse element EH is low than the sample C having a single resistance portion with thick width.

On the other hand, in sample B, it was found that the temperature increase of the electric fuse element EH with respect to the temperature increase of the resistance layer RL is comparable to sample C. Therefore, when the resistance layer RL is divided into a plurality of resistance portions RLa to RLc and they are connected in parallel as in sample B, even if the wiring width W5 of each of the resistance portions RLa to RLc is narrow, it was found that the efficiency of heating the electric fuse element EH is comparable to the sample C.

According to the present modified example, the resistance layer RL is divided into a plurality of resistance portions RLa to RLc and connected in parallel, even if the wiring width W5 of each of the resistance portions RLa to RLc is narrow, the heating efficiency of the electric fuse element EH can be made as high as in the case of using the resistance layer RL having a thick width.

Further, according to the present modified example, since the wiring width W5 of each of the resistance portions RLa to RLc is narrow, it is possible to improve the fusing resistance of the resistance layer RL itself than when having the thick wiring width W4.

Third Embodiment

Next, the configuration of the semiconductor device according to the third embodiment will be described with reference to FIGS. 12 and 13.

Figure 12:
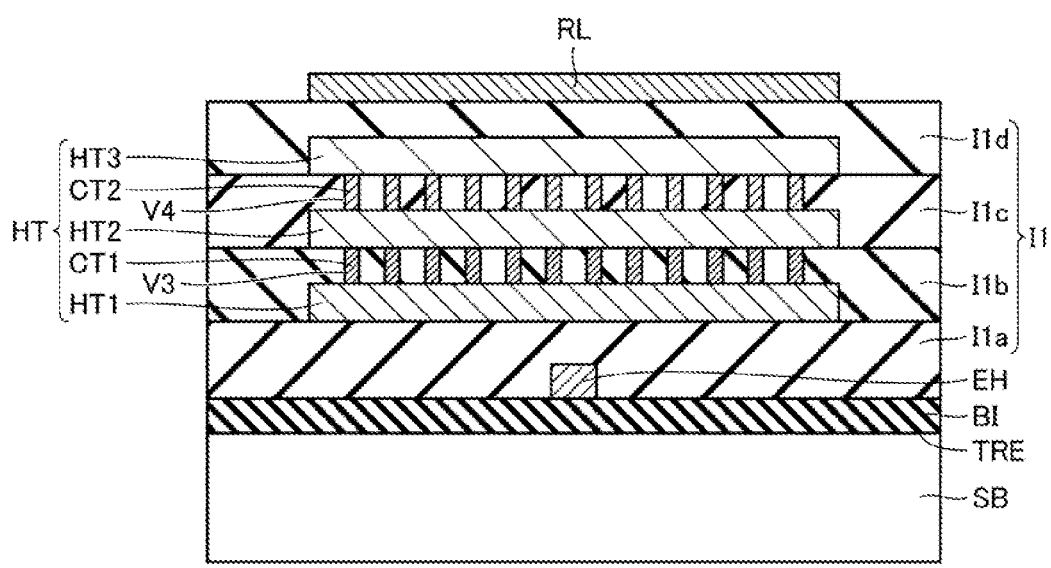
FIG. 12 is a cross-sectional view showing a configuration of a semiconductor device according to third embodiment.

As shown in FIG. 12, in the present embodiment, a heat transfer body HT is arranged between the electric fuse element EH and the resistance layer RL. The heat transfer body HT has a higher thermal conductivity than the interlayer dielectric layer I1.

The heat transfer body HT has, for example, a plurality of heat transfer layers HT1, HT2, HT3. The plurality of heat transfer layers HT1 to HT3 is laminated to each other. Each of the plurality of heat transfer layers HT1 to HT3 is made of, for example, aluminum, copper, aluminum-copper or the like.

The heat transfer layer HT1 is arranged in contact with the upper surface of the interlayer dielectric layer I1a covering the electric fuse element EH. The heat transfer layer HT1 is covered by the interlayer dielectric layer I1b. The heat transfer layer HT2 is arranged in contact with the upper surface of the interlayer dielectric layer I1b. The heat transfer layer HT2 is covered by the interlayer dielectric layer I1c. The heat transfer layer HT3 is arranged in contact with the upper surface of the interlayer dielectric layer I1c. The heat transfer layer HT3 is covered by the interlayer dielectric layer I1d. The resistance layer RL is arranged in contact with the upper surface of the interlayer dielectric layer I1d.

The interlayer dielectric layers I1a, I2b, I1c, I1d configure an interlayer dielectric layer I1 arranged between the electric fuse element EH and the resistance layer RL.

The heat transfer body HT has connection portions CT1, CT2 for electrically connecting each of the plurality of heat transfer layers HT1 to HT3 to each other. The connection portion CT1 has a plurality of via conductive layers CT1. The connection portion CT2 has a plurality of via conductive layers CT2.

Each of the plurality of via conductive layers CT1 is embedded in a plurality of via holes V3 provided in the interlayer dielectric layer I1b. The plurality of via holes V3 has reached the heat transfer layer HT1 from the upper surface of the interlayer dielectric layer I1b. The heat transfer layer HT1 and the heat transfer layer HT2 are electrically connected by the plurality of via conductive layers CT1.

Each of the plurality of via conductive layers CT2 is embedded in a plurality of via holes V4 provided in the interlayer dielectric layer I1c. The plurality of via holes V4 has reached the heat transfer layer HT2 from the upper surface of the interlayer dielectric layer I1c. The heat transfer layer HT2 and the heat transfer layer HT3 are electrically connected by the plurality of via conductive layers CT2.

Each of the via conductive layers CT1, CT2 is made of, for example, tungsten (W). Each of the via conductive layers CT1, CT2 may have a barrier metal (e.g., titanium nitride (TiN)) arranged between tungsten and the interlayer dielectric layers I1b, I1c.

A multilayer wiring structure is configured by the plurality of heat transfer layers HT1 to HT3 and the plurality of via conductive layers CT1, CT2, for example. Each of the heat transfer layers HT1 to HT3 is a dummy wiring. The dummy wiring is a wiring that is electrically isolated from other electric elements and does not transmit an electric signal.

Figure 13:
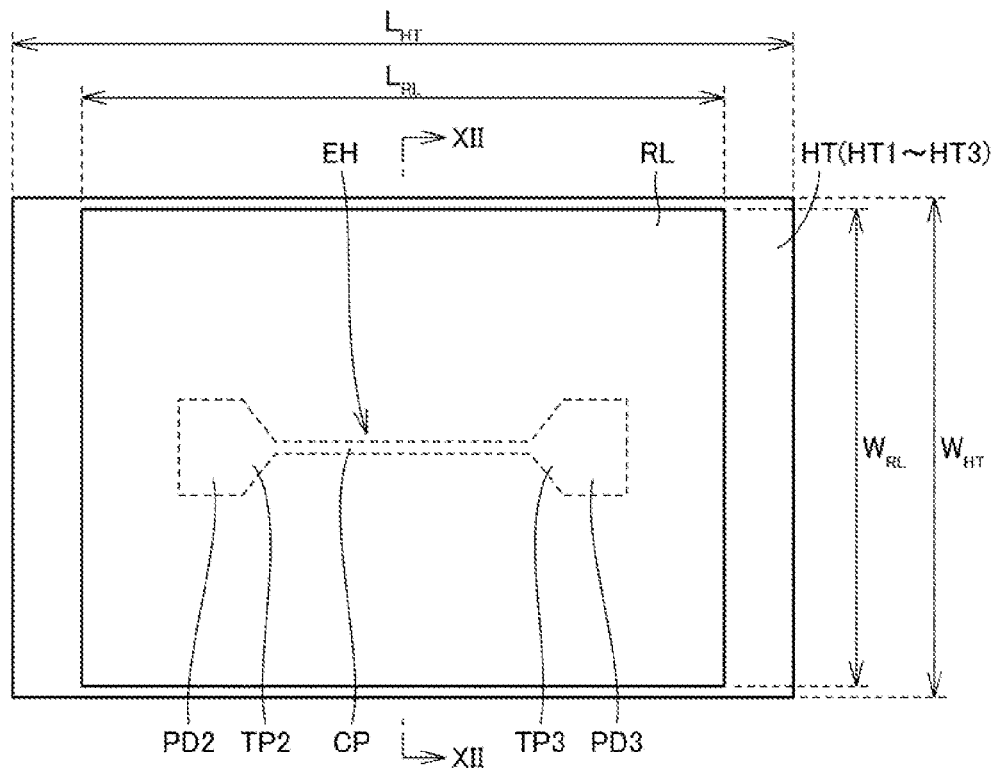
FIG. 13 is a plan view showing the configuration of the semiconductor device according to the third embodiment.

As shown in FIG. 13, each of the plurality of heat transfer layers HT1 to HT3 included in the heat transfer body HT overlaps the entire electric fuse element EH in plan view. The wiring length $L_{HT}$ of each of the plurality of heat transfer layers HT1 to HT3 is preferably equal to or greater than the wiring length $L_{RL}$ of the resistance layer RL. The wiring width $W_{HT}$ of each of the plurality of heat transfer layers HT1 to HT3 is, for example, equal to a width greater than the wiring width $W_{RL}$ of the resistance layer RL.

Each of the wiring length $L_{HT}$ of each of the plurality of heat transfer layers HT1 to HT3 and the wiring length $L_{RL}$ of the resistance layer RL has a dimension in which a current flows through the electric fuse element EH in plan view. Each of the wiring width $W_{HT}$ of each of the plurality of heat transfer layers HT1 to HT3 and the wiring width $W_{RL}$ of the resistance layer RL has a dimension in a direction perpendicular to a direction in which a current flows through the electric fuse element EH in plan view.

Since the configuration of the present embodiment other than the above is substantially the same as the configuration of the first embodiment, the same elements are denoted by the same reference numerals, and descriptions thereof will not be repeated.

Figure 14:
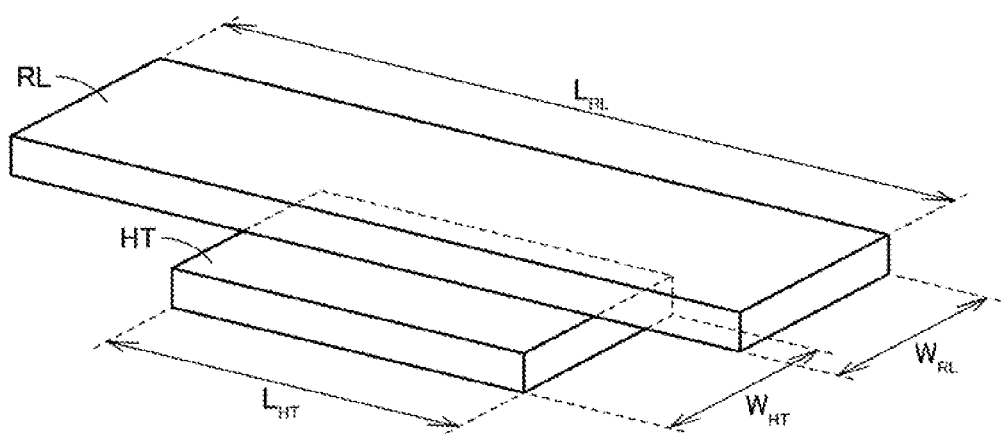
FIG. 14 is a perspective view for explaining the configuration used in the simulation.

As shown in FIG. 14, the present inventors have investigated changes in heat transfer efficiencies from the resistance layer RL to the electric fuse element EH when the wiring length $L_{HT}$ and the wiring width $W_{HT}$ of the heat transfer body HT are changed in a configuration in which a single layer of the heat transfer body HT is arranged between the electric fuse element EH and the resistance layer RL. The simulation was performed with the wiring length $L_{RL}$ of the resistance layer RL fixed at 47.5 µm and with the wiring width $W_{RL}$ fixed at 9.5 µm. The result is shown in FIG. 15.

Figure 15:
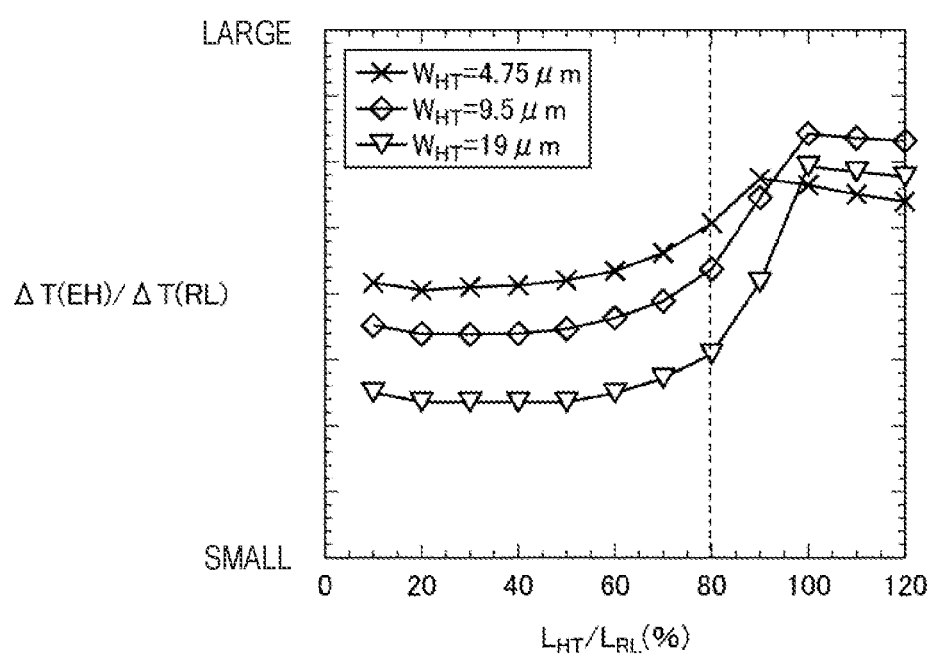
FIG. 15 is a diagram showing the relationship between the ratio of the length of the electric fuse element to the resistor and the efficiency of the heat transfer from the resistor to the electric fuse element.

In the graph of FIG. 15, the horizontal axis is the ratio ($L_{HT}/L_{RL}$) of the wiring length $L_{HT}$ of the heat transfer body HT to the wiring length $L_{RL}$ of the resistance layer RL. The vertical axis is the ratio of the temperature change ΔT of the electric fuse element EH with respect to the temperature change ΔT (RL) of the resistance layer RL (EH) (ΔT (EH)/ΔT (RL)), and shows the heat transfer efficiency from the resistance layer RL to the electric fuse element EH.

From the result of FIG. 15, it was found that when the ratio ($L_{HT}/L_{RL}$) of the wiring length $L_{HT}$ of the heat transfer body HT with respect to the wiring length $L_{RL}$ of the resistance layer RL reaches 80% or more, the heat transfer efficiency (ΔT(EH)/ΔT(RL)) is improved. It was also found that the improvement of the heat transfer efficiency (delta T(EH)/delta T(RL)) at a ratio ($L_F L_{RL}$) of 80% or more was more remarkable as the wiring width WT of the heat transfer HT was larger.

When the wiring length $L_{RL}$ of the resistance layer RL and the wiring length $L_{FT}$ of the heat transfer body HT have the same dimensions (that is, when the ratio ($L_{HT}/L_{RL}$) is 100%), it was found that the heat transfer efficiency (ΔT (EH)/ΔT(RL)) is maximal. Further by providing the heat transfer body HT, as compared with the case without the heat transfer body HT, it was also found that the heat transfer efficiency (ΔT (EH)/ΔT (RL)) is improved by about three times.

In the present embodiment from the above, since the heat transfer body HT is arranged between the electric fuse element EH and the resistance layer RL, it is possible to transfer heat generated by the resistance layer RL to the electric fuse element EH efficiently. Therefore, it is possible to further reduce the amount of current flowing through the electric fuse element EH when fusing the electric fuse element EH. Therefore, the size of the cutting transistor CT can be further reduced.

The heat transfer body HT may be formed of a single layer. For example, the heat transfer body HT may be configured by only one layer of the heat transfer layers HT1 to HT3 in FIG. 12. This makes it possible to simplify the configuration of the heat transfer body HT.

Further, as shown in FIG. 12, by the heat transfer body HT includes a plurality of heat transfer layers HT1 to HT3, it is possible to efficiently transfer heat from the resistance layer RL to the electric fuse element EH even if the distance between the electric fuse element EH and the resistance layer RL is increased.

Further, as shown in FIG. 12, by the heat transfer body HT includes connection portions CT1, CT2 for connecting each of the plurality of heat transfer layers HT1 to HT3 to each other, it is possible to efficiently transfer heat between the plurality of heat transfer layers HT1 to HT3.

Also as shown in FIG. 13, at least one of the plurality of heat transfer layers HT1 to HT3 overlaps the entire resistance layer RL in plan view, and has a plane occupied area larger than the plane occupied area of the resistance layer RL. Therefore, the heat generated from the resistance layer RL can be widely received by at least one of the plurality of heat transfer layers HT1 to HT3, and it is possible to transmit the received heat to the electric fuse element EH. Therefore, it is possible to transfer heat to the electric fuse element EH more efficiently.

Modified Example of Third Embodiment

Next, a modified example of the semiconductor device according to the third embodiment will be described with reference to FIG. 16.

Figure 16:
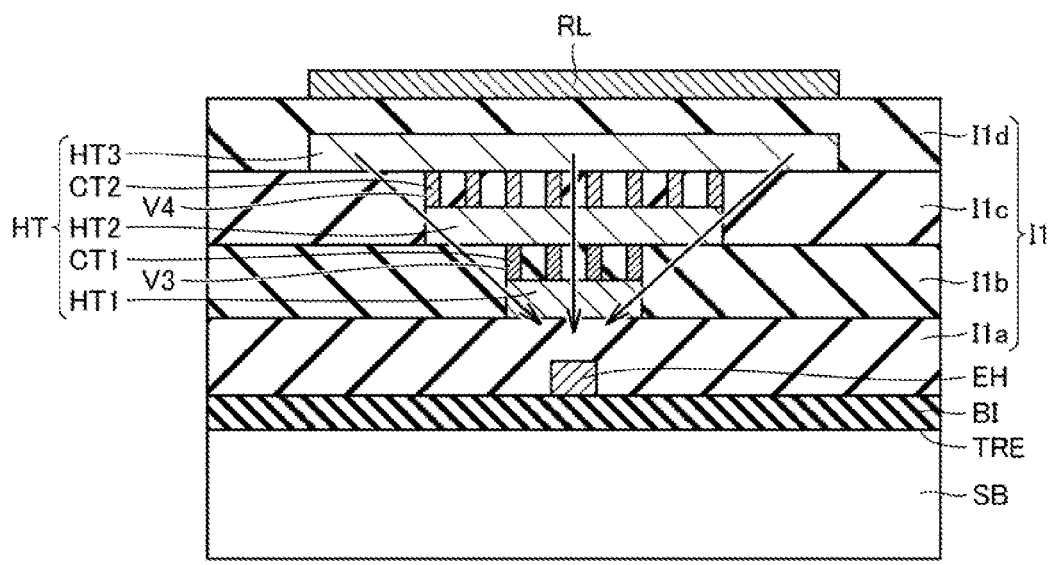
FIG. 16 is a cross-sectional view showing a configuration of a first modified example of the semiconductor device according to the third embodiment.

As shown in FIG. 16, the wiring width of the plurality of heat transfer layers HT1 to HT3 is smaller as the heat transfer layers closer to the electric fuse element EH. Specifically, the heat transfer layer HT2 located near the electric fuse element EH than the heat transfer layer HT3 has a smaller wiring width than the heat transfer layer HT3. Also, the heat transfer layer HT1 located near the electric fuse element EH than the heat transfer layer HT2 has a smaller wiring width than the heat transfer layer HT2.

Since the configuration of the present modified example other than the above is substantially the same as the configuration of the third embodiment, the same elements are denoted by the same reference numerals, and descriptions thereof will not be repeated.

In the present modified example, since the wiring width of the plurality of heat transfer layers HT1 to HT3 is smaller as the heat transfer layer closer to the electric fuse element EH, it is possible to concentrate the heat generated from the resistance layer RL toward the electric fuse element EH. Therefore, it is possible to heat the electric fuse element EH more efficiently.

Figure 17:
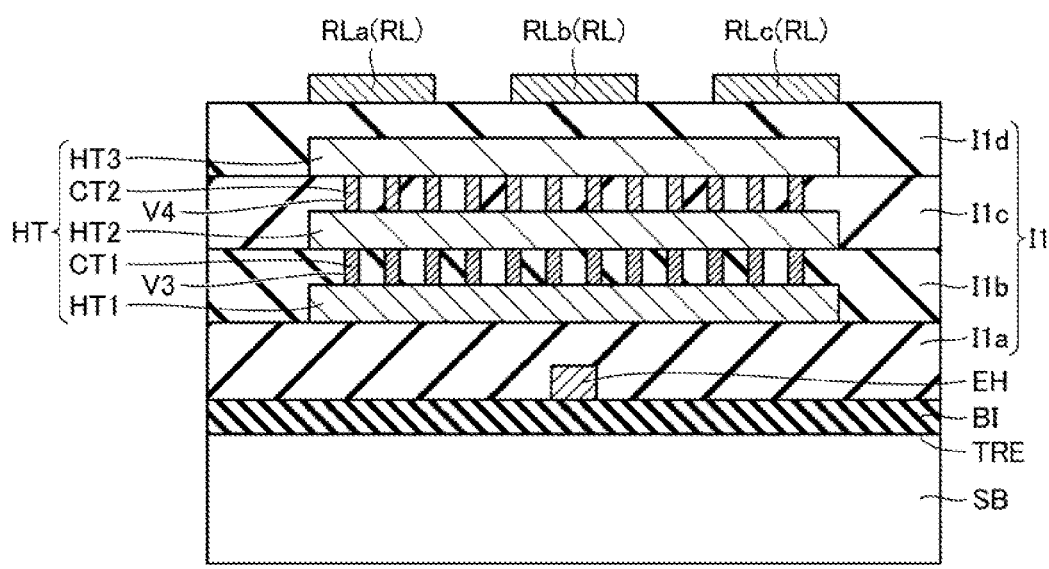
FIG. 17 is a cross-sectional view showing a configuration of a second modified example of the semiconductor device according to the third embodiment.
Figure 18:
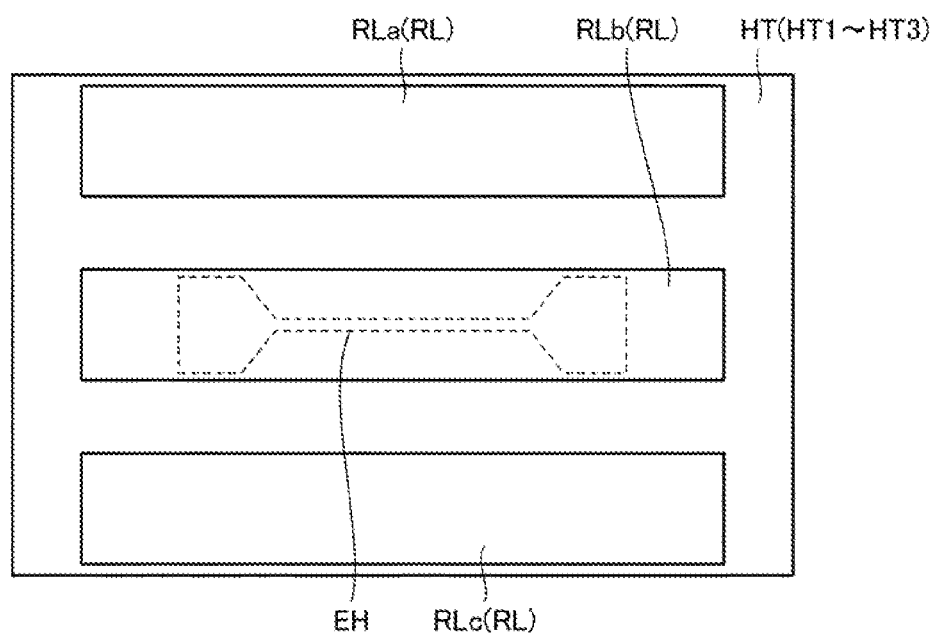
FIG. 18 is a plan view showing the configuration of the second modified example of the semiconductor device according to the third embodiment.

As shown in FIGS. 17 and 18, a configuration in which the heat transfer body HT is provided and a configuration in which the resistance layer RL has a plurality of resistance portions RLa to RLc as in the second embodiment may be combined. Thus, both effects of the second embodiment and the third embodiment can be obtained. Incidentally, the plurality of resistance portions RLa to RLc in FIGS. 17 and 18 may be connected in series, may be connected in parallel.

Other Embodiment

Next, a specific configuration having an electric fuse element EH and a resistance layer RL will be described with reference to FIG. 19.

Figure 19:
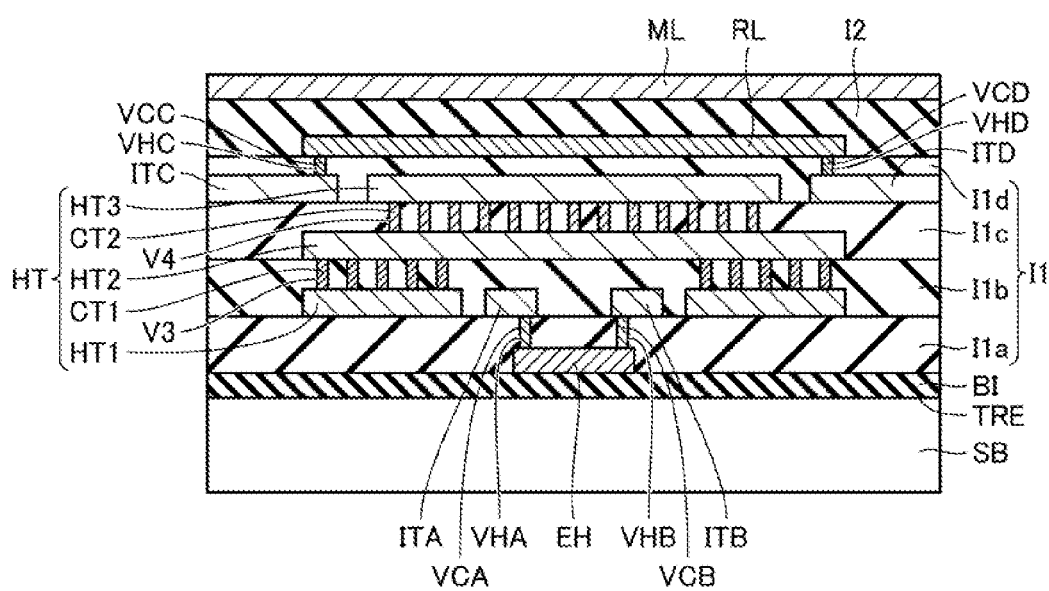
FIG. 19 is a cross-sectional view showing a specific configuration having an electric fuse element and a resistance layer in the semiconductor device according to another embodiment.

As shown in FIG. 19, the semiconductor device has an electric fuse element EH, a heat transfer body HT, a resistance layer RL, and a metal layer ML. The electric fuse element EH is arranged on the STI structure of the semiconductor substrate SB. The electric fuse element EH is made of, for example, doped polysilicon.

The electric fuse element EH is covered by the interlayer dielectric layer I1a. Each of the wiring layers ITA, ITB is arranged on the interlayer dielectric layer I1a. The wiring layer ITA is electrically connected to the electric fuse element EH via the via conductive layer VCA embedded in the via hole VHA in the interlayer dielectric layer I1a. The wiring layer ITB is electrically connected to the electric fuse element EH via the via conductive layer VCB embedded in the via hole VHB in the interlayer dielectric layer I1a.

The heat transfer body HT is arranged directly above the electric fuse element EH. The heat transfer body HT has, for example, a multilayer wiring structure. The heat transfer body HT has a plurality of heat transfer layers HT1 to HT3, and a connection portions CT1, CT2. The heat transfer layer HT1 is formed separately from the same layer as the wiring layers ITA, ITB, for example.

Since the configuration of the heat transfer body HT is substantially the same as the configuration of the heat transfer body HT shown in FIG. 12, the same reference numerals are used for the same elements as in FIG. 12, the description thereof will not be repeated.

The resistance layer RL is arranged directly above the heat transfer body HT and directly above the electric fuse element EH. Each of the wiring layers ITC and ITD is electrically connected to the resistance layer RL. Specifically, the resistance layer RL is electrically connected to the wiring layer ITC via the via conductive layer VCC embedded in the via hole VHC in the interlayer dielectric layer I1d. The resistance layer RL is electrically connected to the wiring layer ITD via the via conductive layer VCD embedded the via hole VHD in the interlayer dielectric layer I1d.

Each of the wiring layers ITC and ITD is configured separately from the same layer as the heat transfer layer HT3, for example.

The resistance layer RL is covered by the interlayer dielectric layer I2. The metal layer ML is arranged on the interlayer dielectric layer I2. The metal layer ML is arranged directly above the resistance layer RL.

In the above, a case where the electric fuse element EH is made of doped polysilicon has been described, the electric fuse element EH may be made of metal such as copper, for example. In this instance, the semiconductor device may have a configuration as shown in FIG. 20, for example.

Figure 20:
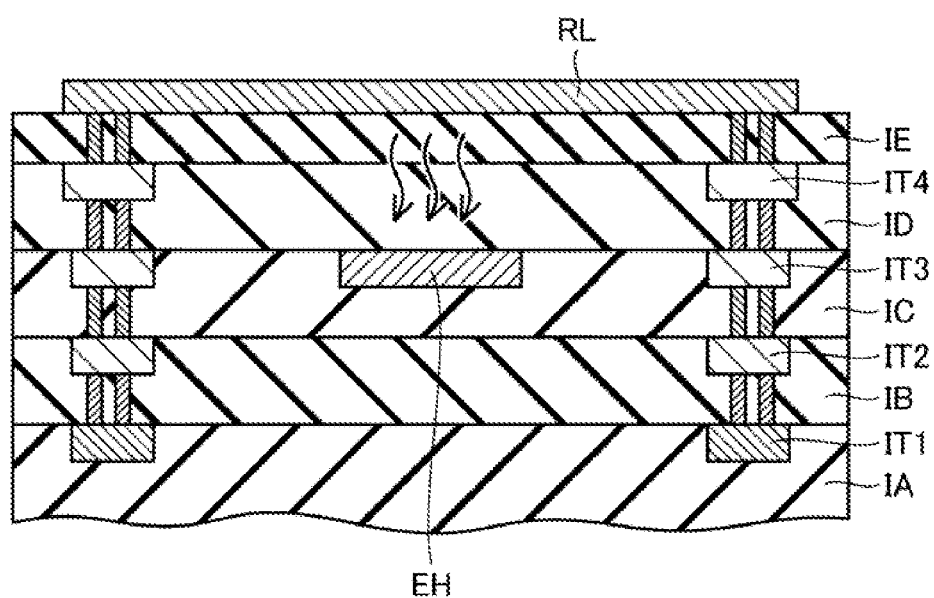
FIG. 20 is a cross-sectional view showing a configuration in which an electric fuse element is made of a metal such as copper in the semiconductor device according to another embodiment.

As shown in FIG. 20, each of the multilayer wiring layers IT1, IT2, IT3, IT4 is formed of, for example, copper or copper alloys. The electric fuse element EH, for example, is formed separately from the same layer as wiring layer IT3, and is made of copper or copper alloy.

The wiring layer IT1 is arranged in a trench provided in the upper surface of the interlayer dielectric layer IA. The interlayer dielectric layer IB is arranged on the interlayer dielectric layer IA. The wiring layer IT2 is arranged in a trench provided in the upper surface of the interlayer dielectric layer IB. The wiring layer IT2 is electrically connected to the wiring layer IT1 via the via conductive layer embedded in the via hole in the interlayer dielectric layer IB.

The interlayer dielectric layer IC is arranged on the interlayer dielectric layer IB. Each of the wiring layer IT3 and the electric fuse element EH is arranged in a trench provided in the upper surface of the interlayer dielectric layer IC. The wiring layer IT3 is electrically connected to the wiring layer IT2 via the via conductive layer embedded in the via hole in the interlayer dielectric layer IC.

The interlayer dielectric layer ID is arranged on the interlayer dielectric layer IC. The wiring layer IT4 is arranged in a trench provided in the upper surface of the interlayer dielectric layer ID. The wiring layer IT4 is electrically connected to the wiring layer IT3 via the via conductive layer embedded in the via hole in the interlayer dielectric layer ID.

The interlayer dielectric layer IE is arranged on the interlayer dielectric layer ID. The resistance layer RL is arranged on the interlayer dielectric layer IE. The resistance layer RL is arranged directly above the electric fuse element EH. The resistance layer RL is made of silicon metal. The resistance layer RL is electrically connected to the wiring layer IT4 via the via conductive layer embedded in the via hole in the interlayer dielectric layer IE.

Although the invention made by the present inventor has been specifically described based on the embodiment, the present invention is not limited to the embodiment described above, and it is needless to say that various modifications can be made without departing from the gist thereof.

What is claimed is:

1. A semiconductor device, comprising:
    an electric fuse element having a first portion, a second portion arranged at one end of the first portion, and a third portion arranged at another end of the first portion;
    an interlayer dielectric layer covering the electric fuse element; and
    a resistance layer on the interlayer dielectric layer, the resistance layer being formed of silicon metal and being arranged directly above the electric fuse element,
    wherein each of a wiring width of the second portion and a wiring width of the third portion is greater than a wiring width of the first portion, and wherein the silicon metal is silicon chromium or carbon-doped silicon chromium.

2. The semiconductor device according to claim 1, further comprising a metal layer arranged directly above the resistance layer.

3. The semiconductor device according to claim 1,
wherein the resistance layer includes a plurality of resistance portions formed of silicon metal, and
wherein the plurality of the resistance portions is electrically connected in series or in parallel.

4. The semiconductor device according to claim 3, wherein each of the plurality of the resistance portions is electrically connected in series so that a current path in the resistance layer meanders in plan view.

5. The semiconductor device according to claim 1, further comprising a heat transfer body arranged between the electric fuse element and the resistance layer and having a higher thermal conductivity than the interlayer dielectric layer.

6. The semiconductor device according to claim 5,
wherein the heat transfer body is configured by a single layer.

7. The semiconductor device according to claim 5,
wherein the heat transfer body includes a plurality of heat transfer layers laminated each other.

8. The semiconductor device according to claim 7, wherein the heat transfer body includes a connection portion connecting each of the plurality of heat transfer layers each other.

9. The semiconductor device according to claim 8, wherein a plane area of at least one heat transfer layer of the plurality of heat transfer layers is larger than a plane area of the resistance layer in plan view.

10. The semiconductor device according to claim 8, wherein a wiring width of the plurality of heat transfer layers is smaller as a heat transfer layer is closer to the electric fuse element.

11. The semiconductor device according to claim 1, further comprising:
a semiconductor substrate;
a trench formed on a surface of the semiconductor substrate; and
a dielectric layer is embedded in the trench,
wherein the electric fuse element arranged on the dielectric layer.

12. The semiconductor device according to claim 1,
wherein the second portion has a second tapered portion and a second pad portion in plan view,
wherein the second tapered portion is connected to the first portion and arranged between the first portion and the second pad portion,
wherein the second tapered portion is configured such that a wiring width of the second tapered portion gradually increases from the first portion toward the second pad portion in plan view,
wherein the third portion has a third tapered portion and a third pad portion in plan view,
wherein the third tapered portion is connected to the first portion and arranged between the first portion and the third pad portion, and
wherein the third tapered portion is configured such that a wiring width of the third tapered portion gradually increases from the first portion toward the third pad portion in plan view.

13. The semiconductor device according to claim 12, further comprising a second wiring layer and a third wiring layer each arranged above the electric fuse element,
wherein the second pad portion is electrically connected to the second wiring layer via a second via conductive layer, and
wherein the third pad portion is electrically connected to the third wiring layer via a third via conductive layer.

14. The semiconductor device according to claim 13, wherein the resistance layer is arranged above the second wiring layer and the third wiring layer.

15. The semiconductor device according to claim 1, wherein the resistance layer overlaps the entire electric fuse element in plan view.

16. The semiconductor device according to claim 1, wherein a wiring width of the resistance layer is greater than the wiring width of the first portion.

17. The semiconductor device according to claim 16, wherein the wiring width of the resistance layer is greater than the wiring width of the second portion and the wiring width of the third portion.

* * * * *